United States Patent [19]

Katzin et al.

[11] Patent Number: 5,451,915
[45] Date of Patent: Sep. 19, 1995

[54] ACTIVE FILTER RESONATOR AND SYSTEM AND NEGATIVE RESISTANCE GENERATOR USABLE THEREIN

[75] Inventors: Peter J. Katzin, Arlington; Yalcin Ayasli, Lexington, both of Mass.; Brian E. Bedard, Hudson, N.H.

[73] Assignee: Hittite Microwave Corporation, Woburn, Mass.

[21] Appl. No.: 69,298

[22] Filed: May 26, 1993

[51] Int. Cl.⁶ .................... H03H 11/04; H03H 11/52
[52] U.S. Cl. ..................... 333/213; 327/553; 331/117 FE; 333/217
[58] Field of Search ............... 333/213, 214, 216, 217, 333/129, 132, 133; 330/294; 331/115, 117 R, 117 FE; 307/322, 324, 490, 520, 521; 327/552, 553

[56] References Cited

U.S. PATENT DOCUMENTS 3,120,616  2/1964  Ishimoto et al. .................... 307/490
3,723,905  3/1973  Sterner et al. ............. 331/117 FE X
5,053,650 10/1991  Ohkubo et al. ..................... 307/521

OTHER PUBLICATIONS

Sutton, *Design of high-stability variable frequency oscillators*, Electronics Industry, Jun. 1976, pp. 27–29.
C. L. Farell, *Designing FET Oscillators*, EEE–Circuit Design Engineering, Jan. 1967, pp. 86–90.

*Primary Examiner*—Paul Gensler
*Attorney, Agent, or Firm*—Iandiorio & Teska

[57] ABSTRACT

A negative resistance generator includes first and second terminals; first and second inductors connected in series between the terminals; and a semiconductor amplifying device having a first control electrode connected to the first terminal and a first active electrode connected to the second terminal and a second active electrode connected to the junction of the inductors. When employed in an active filter resonator a first variable capacitor is interconnected with the inductors for setting the resonant frequency of the resonator. The resonators may be combined in an active filter with a transmission line where each of the resonators is interconnected to the line by decreasing resistance from the input to the output in order to balance the rf currents to which the resonators are subjected. An improved dual loop active filter control system is achieved by using a master oscillator that employs a resonator that is matched to the active filter resonator in the filter and servoing the frequency and Q-factor controls so that the drive signals are compensated for temperature drifts, manufacturing tolerances, and other problems while a buffer amplifier is used between the master oscillator and the frequency and gain control loops for isolating the master oscillator reference circuit from the loading of the loops and from the perturbation introduced by the frequency reference signal; a frequency shifting circuit in the frequency control loop permits the reference signal to be shifted to a lower or higher frequency than that of the master oscillator.

10 Claims, 4 Drawing Sheets

ACTIVE FILTER RESONATOR AND SYSTEM AND NEGATIVE RESISTANCE GENERATOR USABLE THEREIN

FIELD OF INVENTION

This invention relates to an improved negative resistance generator and an improved active filter resonator using that generator as well as a high power active filter configuration and an improved dual loop control system for an active filter.

BACKGROUND OF INVENTION

As microwave system components shrink in size through increasing levels of integration, there is a need to miniaturize the rf filtering functional blocks as well, such as narrow-band interference rejection filters or mixer sideband selection filters. Unfortunately, the achievable quality (Q) factor of the reactive filter components (e.g., capacitors, inductors, and transmission lines) decreases with size. Also, in applications which require filter tuning through varactor diodes, the finite Q of these devices will introduce losses as well. These factors make it difficult or impossible to implement passive narrow-band, high-selectivity filters in Monolithic Microwave Integrated Circuit (MMIC) form with acceptable performance using cost-effective, standard fabrication processes. However, it is possible to overcome component losses (enhance their Q-factor) by using active devices as negative resistance generators, which can be integrated in MMIC form.

Several narrow-band UHF/microwave active filter circuits have been demonstrated using discrete components, but they have not found widespread use due to several factors. One of the main problems is that these circuits are very sensitive to fluctuations in both active and passive component parameters, due to such factors as variations in fabrication process and changes in bias voltages and in ambient temperatures. Also, prior art enhancement circuits tend to use fairly complex circuit networks to satisfy both rf impedance and DC bias requirements of the active devices.

There are additional problems with conventional apparatus: in applications which require controlled-bandwidth tunable notch filters, circuit parasitics tend to cause undesirable changes in the notch bandwidth as its center-frequency is varied; the rf power handling capability of these circuits is limited, to a much greater degree than for amplifiers, by the size of the active devices needed to compensate for the power lost in the passive components; and in the rejection band of a multistage active filter, the earlier stages of the filter are subject to the greatest power loading which underutilizes later stages and requires higher capacity earlier stages; in dual loop master-slave active filter control systems which control the gain and frequency of the filter the master oscillation reference is loaded down by the loops themselves and is perturbed by the external frequency reference signals introduced to control the frequency of the filter. These perturbations degrade the tracking between the slaved filter and the master oscillator, so that the filter is incorrectly tuned; also it is often desirable to use an external reference signal at a frequency far removed from the filter tuning frequency.

SUMMARY OF INVENTION

It is therefore an object of this invention to provide an improved negative resistance generator.

It is a further object of this invention to provide such an improved negative resistance generator which is simpler, requires less complex d.c. biasing networks, and lends itself to becoming a part of an LC active filter.

It is a further object of this invention to provide an improved active filter resonator.

It is a further object of this invention to provide such an improved active filter resonator which has independent control over Q-factor and frequency.

It is a further object of this invention to provide such an improved active filter resonator which has higher sensitivity Q control.

It is a further object of this invention to provide such an improved active filter resonator which can operate at higher frequencies.

It is a further object of this invention to provide such an improved active filter resonator which provides constant bandwidth over the center frequency tuning range.

It is a further object of this invention to provide such an improved active filter resonator capable of higher power handling.

It is a further object of this invention to provide an improved dual loop active filter control system which prevents loading of the master oscillator reference circuit by the control circuitry and prevents reference signals from perturbing the master oscillator reference.

It is a further object of this invention to provide such an improved dual loop active filter control system which allows use of a frequency reference signal shifted in frequency from the master oscillator and slaved filter tuning frequency.

This invention features a negative resistance generator having first and second terminals and first and second inductors connected in series between the terminals. A semiconductor amplifying device has a first electrode connected to the first terminal, a first active electrode connected to the second terminal, and a second active electrode connected to the junction of the inductors.

In a preferred embodiment a second control electrode may be provided for controlling the transconductance of the semiconductor device to control the value of the negative resistance generated. A bootstrap capacitor may be interconnected between the second control electrode and the junction of the inductors for maintaining linearity of the transconductance of the semiconductor device under large a.c. voltage amplitudes.

The negative resistance generator may also include an FET used for introducing a measured amount of loss to the negative resistance generator, having one active electrode connected to the junction of the inductors, a second active electrode connected to one of the terminals, and at least one control electrode connected to a high impedance network.

The invention also features an active filter resonator including a negative resistance generator having first and second terminals, first and second inductors connected in series between the terminals, and a semiconductor amplifying device having a first control electrode connected to the first terminal, a first active electrode connected to the second terminal, and a second active electrode connected to the junction of the inductors. There is a first variable capacitor means interconnected with the inductors for setting the resonance frequency of the resonator.

In a preferred embodiment there may be a second control electrode for controlling the transconductance of the semiconductor device to control the value of the negative resistance generated. There may be a bootstrap capacitor interconnected between the second control electrode and the junction of the conductors for maintaining linearity of the transconductance of the semiconductor device for large a.c. voltage amplitudes. The first variable capacitor means may be connected in parallel with the inductors or in the series connection. There may be a compensation capacitor connected in parallel with the first variable capacitor means for compensating for the parasitic capacitance of the resonator. A second variable capacitor means may be connected in parallel with the inductors for adjusting the bandwidth or the resonator. There may also be means for applying a control signal to both the first and second variable capacitor means for maintaining the bandwidth of the filter comprising the resonator over its tuning range. The second variable capacitor means may be connected in parallel with the inductors and there may be means for applying a separate control signal to each of the variable capacitor means for varying both the resonant frequency and the bandwidth of the filter comprising the resonator.

The invention also features an active filter having a transmission line structure with an rf input and an rf output and a plurality of active filter resonators. There is a like plurality of interconnection means for interconnecting the active filter resonators at spaced intervals along the transmission line structure between the rf input and output. The interconnection means include decreasing resistance from the input to the output for balancing the rf currents through the resonators. In a preferred embodiment each of the active filter resonators may include a negative resistance generator having first and second terminals, first and second inductors connected in series between the terminals, a semiconductor amplifying device having a first control electrode connected to the first terminal, a first active electrode connected to the second terminal, a second active electrode connected to the junction of the inductors, and first variable capacitor means interconnected with the inductors tier setting the resonant frequency of the resonator.

This invention also features a dual loop active filter control system including an active filter including at least one active filter resonator; a master oscillator reference circuit including an active filter resonator matched to the at least one active resonator filter; an amplitude control loop for providing a Q-factor control signal by servoing the gain of the master oscillator reference circuit and the Q-factor control of the at least one active filter resonator in the active filter. A frequency control loop provides a frequency control signal by servoing the frequency of the master oscillator reference circuit and the frequency of the at least one active filter resonator in the active filter. A buffer amplifier interconnected between the master oscillator reference and each of the loops isolates the master oscillator reference from perturbation by the loops.

In a preferred embodiment each of the active filter resonators may include first and second terminals, first and second inductors connected in series between the terminals; a semiconductor amplifying device having a first control electrode connected to the first terminal, a first active electrode connected to the second terminal, a second active electrode connected to the junction of the inductors, and first variable capacitor means interconnected with the inductors for setting the resonant frequency of the resonator. The frequency control loop may include a frequency shifting means for matching the output frequency of the master oscillator reference circuit to a different reference frequency input, and a phase detector circuit responsive to the frequency reference input and to the frequency-shifted master oscillator reference circuit output signal for producing the frequency control signal.

DISCLOSURE OF PREFERRED EMBODIMENT

Other objects, features and advantages will occur to those skilled in the art from the following description of a preferred embodiment and the accompanying drawings, in which.

Figure 1:
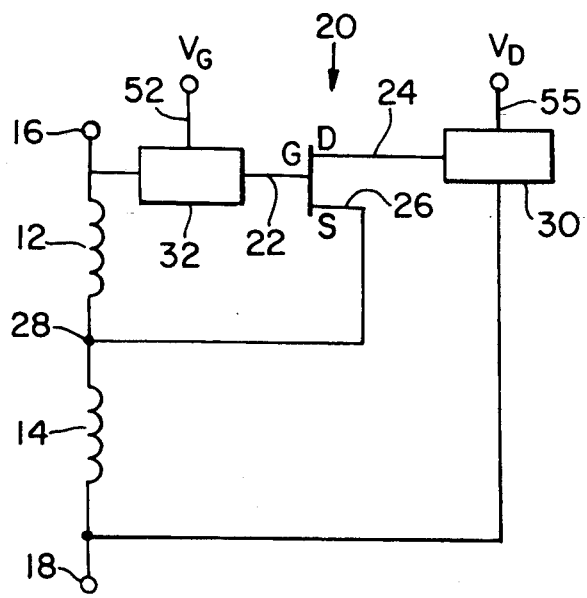
FIG. 1 is a simplified schematic diagram of a negative resistance generator according to this invention.

There is shown in FIG. 1 a negative resistance generator 10 according to this invention which includes a pair of inductances 12 and 14 interconnected in series between a pair of terminals 16 and 18. A semiconductor amplifying device such as transistor 20 is arranged with its control electrode 22 a.c. connected to terminal 16, one of its active electrodes 24 a.c. connected to terminal 18, anti its other active electrode 26 connected to the junction 28 between inductors 12 and 14. In a specific case as shown in FIG. 1, transistor 20 is an FET so that its control electrode is a gate and its active electrodes 24 and 26 are the drain and source. Generator 10 is an rf circuit and thus a d.c. blocking bias network 30 such as a capacitor is required in the circuit of drain electrode 24. It is also preferable in some cases to add a d.c. bias network 32 such as a capacitor and resistor connected to gate 22. A separate gate voltage $V_G$ can then be supplied at terminal 52 and connected to gate 22 through an rf decoupling resistor in network 32. Drain voltage $V_D$ is supplied at terminal 55. The equivalent circuit of FIG. 1 appears as a lumped inductor of value approximately equal to the sum of the inductance of inductor 12 plus the inductance of inductor 14, in series with a negative resistance. Generator 10 enables simple d.c. biasing and easy incorporation in resonators and is also easy to implement in monolithic microwave integrated circuit (MMIC)/fabrication technology.

Figure 2:
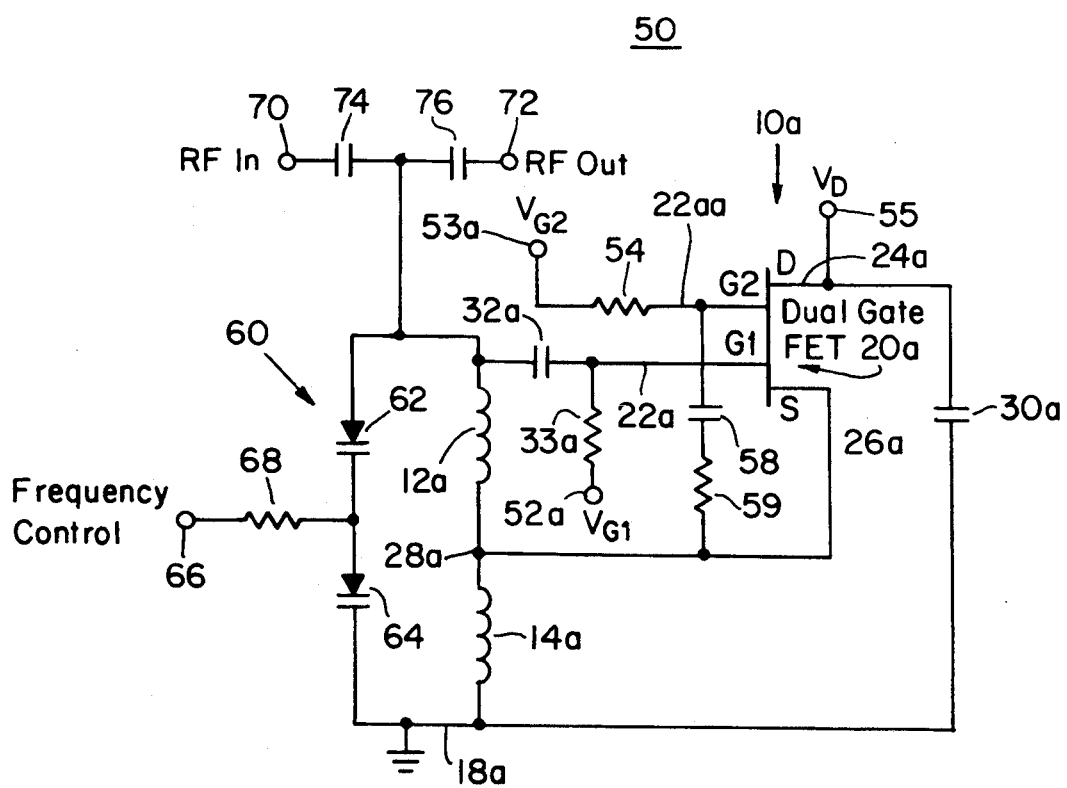
FIG. 2 is a simplified schematic diagram of an active filter resonator according to this invention including the negative resistance generator of FIG. 1 with a parallel resonance circuit, and a dual-gate FET to control the negative resistance value.

Negative resistance generator 10 may be employed in an active filter resonator 50, FIG. 2, according to this invention. Generator 10a includes a dual-gate FET 20a which includes two gates 22a and 22aa. The d.c. voltage $V_{G2}$ is applied at Q-control terminal 53a through rf decoupling resistor 54 to gate 22aa, which controls the gain of FET 20a, thus the negative resistance. Gate 22a receives the rf signal through capacitor 32a which blocks the d.c. current between terminal 16a and gate 22a. The d.c. voltage $V_{G1}$ at terminal 52a is applied to gate 22a through rf alecoupling resistor 33a. Voltage $V_{G1}$ is adjusted for optimum rf power handling of FET 20a. Capacitor 58 is a bootstrap capacitor which maintains the same a.c. potential between gate 22aa and source 26a to maintain the linearity of the transconductance throughout the power range of operation. Resistor 59 in series with capacitor 58 prevents high-frequency parasitic oscillations from occurring. Inductors 12a and 14a are connected in parallel resonance circuit 60 with varactor diodes 62 and 64. A frequency control d.c. signal is delivered at terminal 66 through rf decoupling resistor 68 to adjust the capacitance of varactor diodes 62 and 64 to tune parallel resonance circuit 60 to the desired frequency to achieve the filtration of the rf signal which is presented at the rf input 70 and delivered at rf output 72. The varactor diodes 62 and 64 are used ill pairs to share the rf voltage swing across the resonator so that higher power operation can be achieved, and distortion can be minimized. Coupling capacitors 74 and 76 are used to couple the rf signal in and out of the filter. Voltage $V_d$ is applied to terminal 55 to provide proper d.c. drain bias for FET 20a. Capacitor 30a provides a d.c. block and a.c. short between FET drain electrode 24a and terminal 18a.

The dual gate FET 20a in FIG. 2 provides very sensitive negative resistance control, but it requires a larger FET for a given value of negative resistance than a circuit using a single gate FET as the amplifying device. Hence the FIG. 2 resonator circuit is less suited for implementing the highest-frequency, highest power active filters.

Figure 3:
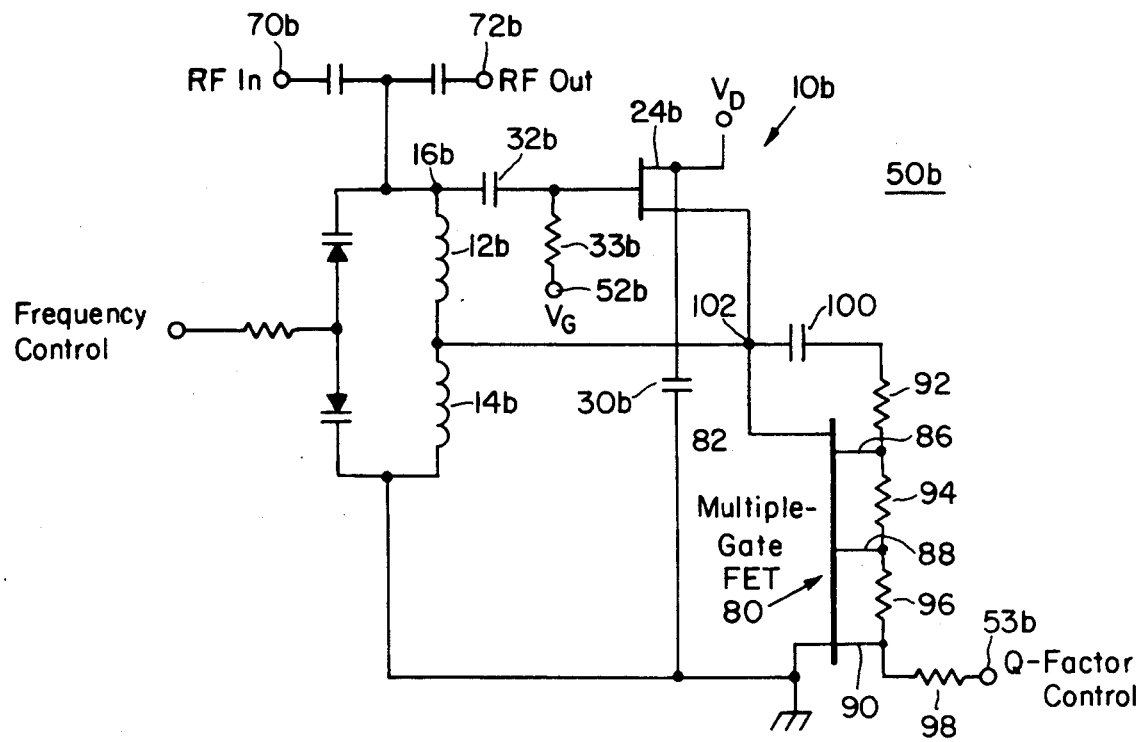
FIG. 3 is an active filter resonator similar to FIG. 2 using an insertion loss circuit to control negative resistance value.

While in FIG. 2 the Q-factor of active filter resonator 50 was adjusted by increasing the negative resistance through modulation of the gain of the dual-gate FET 20a, in active filter resonator 50b, FIG. 3, the adjustment is made by actually introducing a controlled amount of extra loss which can then be compensated for by the gain provided by negative resistance generator 10b. This is accomplished by adding, for example, FET 80 having one active electronic, for example the drain electrode 82 connected to the junction 28b of inductors 12b and 14b, and the other active electrode 84, for example, the source electrode, connected to terminal 18b. FET 80 may have one or a number of gate electrodes. For example, there are three shown in FIG. 3, gates 86, 88 and 90, interconnected by an rf voltage-divider network including resistors 92, 94, 96 and 98, which terminates at one end in the Q-factor control terminal 53b. At the other end resistor 92 is connected through d.c. blocking capacitor 100 to drain electrode 82 at junction 102 and to junction 28b between inductors 12b and 14b. In operation, any rf voltage present at junction 102 will be divided evenly amongst the three gate electrodes 86, 88 and 90 so that the burden will be shared equally by each of the gate junctions which enables the FET to handle larger signals while maintaining linearity. As indicated earlier, this configuration associated with FET 80 actually inserts a small, but variable, amount of extra loss or resistance into the system, which is then overcome by the fixed negative resistance generator 10b. Gate 22b of FET 20b receives the rf signal through capacitor 32b which blocks the d.c. current between terminal 16b and gate 22b.

Figure 4:
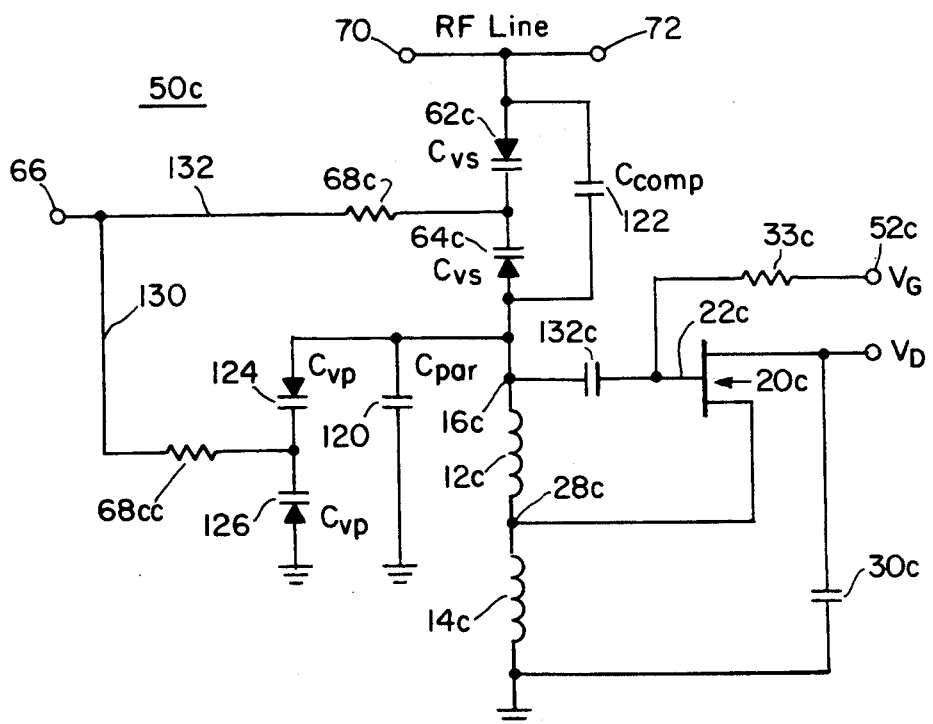
FIG. 4 is a simplified schematic block diagram of an active filter resonator employing the negative resistance generator of FIG. 1 with a series resonant circuit.

Although thus tier the active filter resonators 50 and 50b, FIGS. 2 and 3, are both shown as including parallel resonance circuits, this is not a necessary limitation of the invention. For example, as shown in FIG. 4, a series resonant circuit, e.g., for a notch filter, may also be employed as shown with respect to active filter resonator 50c, FIG. 4, where inductors 12c and 14c are connected in series with varactors 62c and 64c. Equivalent capacitor 120 includes the parasitic capacitance associated with physical component layout and the intrinsic capacitance associated with the active device 20c. In this configuration parasitic capacitance 120 is compensated for by adding compensator capacitor 122 in parallel with varactors 62c and 64c. In order to maintain constant bandwidth, additional varactors 124 and 126 are added in parallel with inductors 12c and 14c and parasitic capacitance 120. The presence of varactors 124 and 126 bestows a number of advantages. First, by properly selecting capacitor 122 so that the ratio of the capacitance of varactors 62c and 64c to capacitor 122 is the same as the capacitance of varactors 124 and 126 to parasitic capacitance 120 and if a single frequency-tuning control signal is applied at terminal 66, then the fractional variation in the capacitance of varactors 124 and 126 will track that of varactors 62c and 64c so that the filter bandwidth will remain the same over its entire tuning range. Alternatively, if control line 130 is decoupled from input line 132, then the frequency to which the resonator is tuned and the bandwidth of the filter can be independently controlled. Gate 22c of FET 20c receives rf signal through capacitor 32c which blocks the d.c. current between terminal 16c and gate 22c.

Figure 5:
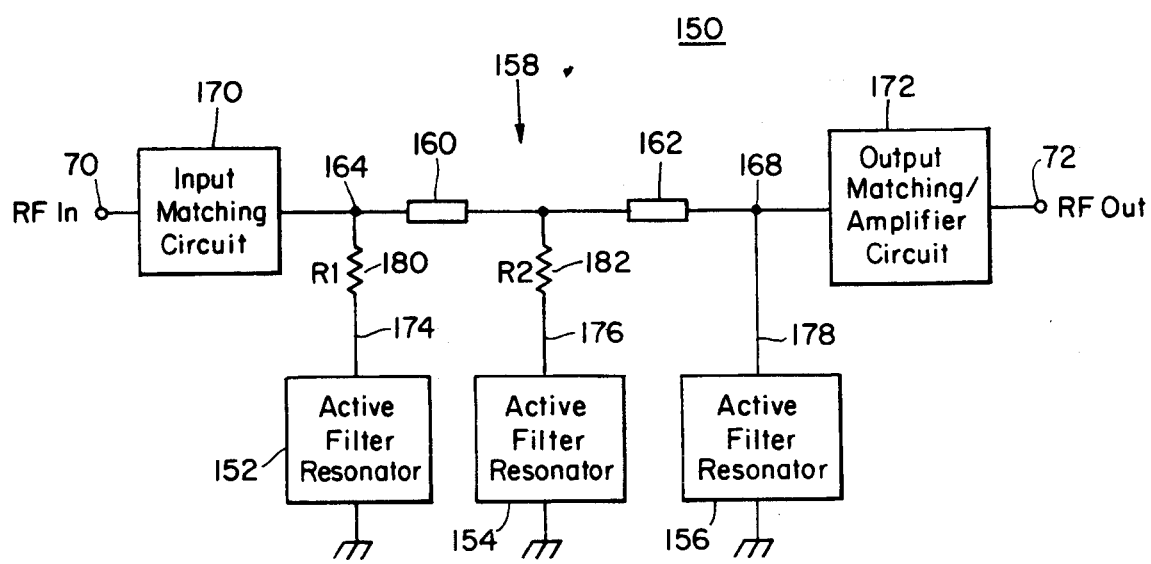
FIG. 5 is a current-balanced active filter according to this invention.

An active filter 150, FIG. 5, can be constructed using active filter resonators as disclosed in FIGS. 2, 3 and 4, or any other type of active filter resonators. Active filter resonators 152, 154 and 156 are connected at spaced intervals 164, 166 and 168 to a transmission line structure 158 formed of transmission lines 160, 162. Input and output matching amplifier circuits 170, 172 are provided at rf input 70 and rf output 72, respectively. In accordance with this invention each resonator 152, 154 and 156 is connected by interconnection means 174, 176, 178 to transmission line structure 158. In accordance with this invention each of these interconnection means includes a resistor of decreasing resistance moving from the rf input 70 to the rf output 72. Thus resistance 180 may be equal to 12Ω, resistance 182 9Ω, and interconnection means 178 may have zero resistance. In this way, in the filter rejection band high-power signal currents presented at rf input 70 are not shunted to ground wholly through the first active filter resonator 152 but are distributed more evenly so that approximately one third of the rf current is accommodated in each or the resonators 152, 154 and 156. This prevents the need for an impractically high power resonator to be implemented at resonator 152, and progressively lower power resonators to be implemented at resonators 154 and 156.

Figure 6:
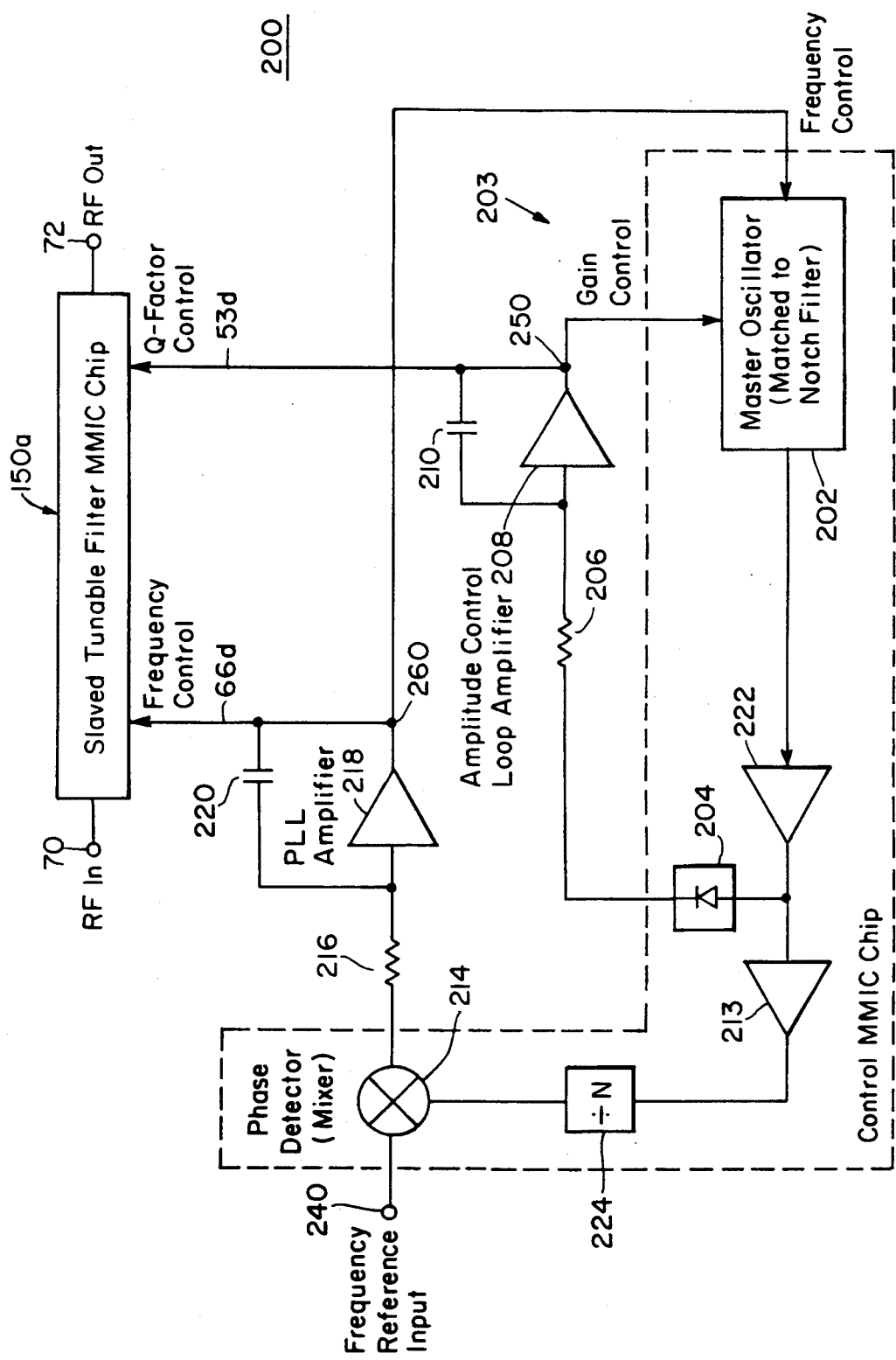
FIG. 6 is a simplified schematic diagram of a dual loop active filter control system according to this invention.

An improved dual loop active filter control system 200, FIG. 6, can be achieved according to this invention using a slaved tunable filter MMIC chip 150a which includes one or more resonators 152, 154 and 156 which may be of a type shown in FIGS. 2, 3 and 4 or of some comparable type, each of which requires a frequency control provided at 66d and Q-factor control 53d. Control system 200 includes master oscillator 202 which is implemented with an active filter resonator which matches the one or more active filter resonators used in slaved tunable filter 150a. System 200 also includes a gain control loop 203 consisting of loosely-coupled amplifier 222, detector diode 204, integrator resistor 206, and loop amplifier 208 with integrator capacitor 210. Frequency loop 212 includes amplifiers 213,222, (optional) frequency divider 224, phase detector 214, integrator resistor 216, and loop amplifier 218 with integrator capacitor 220.

In accordance with this invention buffer amplifier 222 is included in both control loops and is very loosely coupled to master oscillator 202 so that the master oscillator 202 is isolated not only from the loading of the other loop 212 components, but is also isolated from perturbations due to frequency reference input signal at terminal 240 of phase detector 214 leaking through to the master oscillator. Further protection against perturbation is provided by amplifier 213 and frequency divider 224. The output of master oscillator 202 is delivered by amplifier 222 to diode detector 204 which feeds back a d.c. level through resistor 206 to amplifier 208 representative of the amplitude of oscillator 202 output. The output of amplifier 208 at junction 250 is used to control the steady-state oscillation amplitude of master oscillator 202 and is also used to control the Q-factor at terminal 53d of the active filter resonators in filter 150a. Under steady state oscillation conditions, the gain of the active device in the master oscillator exactly compensates for the losses in the passive components of the oscillator resonator. This gain condition also corresponds to that required to obtain an ideal lossless filter using the same resonator. Thus any change in the loss or gain characteristics in the active and passive components of master oscillator 202 due to temperature changes, fabrication differences, or the like are automatically adjusted since filter 150a tracks oscillator 202 in terms of the gain/Q-factor control signal at terminal 53d. In a similar fashion, the frequency of master oscillator 202 is delivered through amplifier 213 and (optional) frequency-shifting circuit 224 to phase detector 214. Any difference in phase between the (frequency-shifted) output of master oscillator 202 and the frequency reference input at terminal 240 is delivered to amplifier 218 and is presented at junction 260 to be sent back as a frequency control signal to master oscillator 202. The same signal at junction 260 is used as the frequency control input at terminal 66d to filter 150a. Thus again any changes in master oscillator 202's frequency due to temperature or other environmental conditions or fabrication distortions or errors is accommodated for because the master oscillator uses an active filter resonator which is matched to the one or more active filter resonators used in filter 150a. The slaved filter resonators may include a compensation element (such as a fixed capacitor) which matches the very small loading effect of the buffer amplifier 222 on the master oscillator 202. In addition the master oscillator 202 may be fabricated at one and the same time on the same chip as the resonators in filter 150a so that any fabrication differences will be minimized.

While typically the frequency reference signal at terminal 240 is at the same frequency as the desired tuning frequency of filter 150a, this is often not the case. For instance, it may be more practical to provide a much lower frequency reference input signal at terminal 240. Use of a reference frequency different from the output frequency of the master oscillator 202 greatly reduces the potential for perturbation of the oscillator by the reference signal, and for leakage of the reference signal into the slaved filter circuit. For this purpose the frequency of master oscillator 202 output signal is shifted, for example by means of frequency divider circuit 224 which reduces the output frequency from master oscillator 202 to a lower one equal to that appearing at terminal 240. If it is desired to increase the frequency then frequency shifting circuit 224 could be a frequency multiplier circuit.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A negative resistance generator comprising:
first and second terminals;
first and second inductors connected in series between said terminals;
a semiconductor amplifying device having a first control electrode a.c. connected to said first terminal, a first active electrode a.c. connected to the second terminal, a second active electrode connected to the junction of said inductors and a second control electrode for controlling the transconductance of said semiconductor device to control the value of the negative resistance generated; and
a bootstrap capacitor interconnected between said second control electrode and the junction of said inductors for maintaining linearity of the transconductance of said semiconductor device for large a.c. voltage variations.

2. A negative resistance generator comprising:
first and second terminals;
first and second inductors connected in series between said terminals;
a semiconductor amplifying device having a first control electrode a.c. connected to said first terminal, a first active electrode a.c. connected to the second terminal and a second active electrode connected to the junction of said inductors; and
an FET used for introducing a measured amount of loss to said negative resistance generator, having one active electrode connected to the junction of said inductors, a second active electrode connected to one of said terminals, and at least one control electrode connected to a high impedance network.

3. An active filter resonator comprising:
a negative resistance generator including first and second terminals; first and second inductors connected in series between said terminals; a semiconductor amplifying device having a first control electrode a.c. connected to said first terminal, a first active electrode a.c. connected to the second terminal, a second active electrode connected to the junction of said inductors; a second control electrode for controlling the transconductance of said semiconductor device to control the value of the negative resistance generated; first variable capacitor means interconnected with said inductors for setting the resonant frequency of the resonator; and a bootstrap capacitor interconnected between said second control electrode and the junction of said inductors for maintaining linearity of the transconductance of said semiconductor device for large a.c. voltage variations.

4. The active filter resonator of claim 3 in which said first variable capacitor means is interconnected in parallel with said inductors.

5. An active filter resonator comprising:

a negative resistance generator including first and second terminals; first and second inductors connected in series between said terminals; a semiconductor amplifying device having a first control electrode a.c. connected to said first terminal, a first active electrode a.c. connected to the second terminal and a second active electrode connected to the junction of said inductors; first variable capacitor means interconnected with said inductors for setting the resonant frequency of the resonator; and an FET having one active electrode connected to the junction of said inductors, a second active electrode connected to one of said terminals, and at least one control electrode connected to a high impedance network, for introducing a measured amount of loss to said negative resistance generator.

6. An active filter resonator comprising:

a negative resistance generator including first and second terminals;

first and second inductors connected in series between said terminals;

a semiconductor amplifying device having a first control electrode a.c. connected to said first terminal, a first active electrode a.c. connected to the second terminal and a second active electrode connected to the junction of said inductors; and a first variable capacitor means interconnected in series with said inductors for setting the resonant frequency of the resonator.

7. The active filter resonator of claim 6 further including a compensation capacitor connected in parallel with said first variable capacitor means for compensating for the parasitic capacitance of the resonator, second variable capacitor means connected in parallel with said inductors for adjusting the bandwidth of the filter, and means for applying a control signal to both said first anti second variable capacitor means for maintaining the bandwidth of the filter over its tuning range.

8. The active filter resonator of claim 6 further including second variable capacitor means connected in parallel with said inductors, and means for applying a separate control signal to each of said variable capacitor means for varying both the tuning frequency and the and bandwidth of the filter.

9. An active filter comprising:

a transmission line structure having an rf input and an rf output;

a plurality of active filter resonators;

a like plurality of interconnection means for interconnecting said active filter resonators at spaced intervals along said transmission line structure between said rf input and output, said interconnection means including decreasing resistance from said input to the said output for balancing the rf currents through said resonators.

10. The active filter of claim 9 in which each of said active filter resonators includes a negative resistance generator including first and second terminals; first and second inductors connected in series between said terminals; a semiconductor amplifying device having a first control electrode a.c. connected to said first terminal, a first active electrode a.c. connected to the second terminal and a second active electrode connected to the junction of said inductors; and first variable capacitor means interconnected with said inductors for setting the resonant frequency of the resonator.

* * * * *